United States Patent [19]

Sakurai

[11] Patent Number: 4,659,422
[45] Date of Patent: Apr. 21, 1987

[54] PROCESS FOR PRODUCING MONOCRYSTALLINE LAYER ON INSULATOR

[75] Inventor: Junji Sakurai, Tokyo, Japan

[73] Assignee: Fujitsu Limited, Kanagawa, Japan

[21] Appl. No.: 592,067

[22] Filed: Mar. 22, 1984

[30] Foreign Application Priority Data

Mar. 31, 1983 [JP] Japan .................................. 58-055873

[51] Int. Cl.⁴ ............................................. C30B 13/22
[52] U.S. Cl. ....................... 156/617 R; 156/DIG. 73; 156/DIG. 80; 156/DIG. 88; 156/DIG. 102; 427/53.1
[58] Field of Search ................. 427/53.1, 54.1; 156/616 R, DIG. 73, DIG. 80, DIG. 88, DIG. 102, 617 R

[56] References Cited

U.S. PATENT DOCUMENTS

| | | | |
|---|---|---|---|
| 3,096,158 | 7/1963 | Gaulé et al. | 156/DIG. 88 |
| 3,585,088 | 10/1968 | Schwuttke et al. | 156/DIG. 80 |
| 3,695,941 | 10/1972 | Green et al. | 156/617 |
| 4,081,313 | 3/1978 | McNeilly et al. | 156/610 |
| 4,120,743 | 10/1978 | Baghdadi et al. | 156/617 R |
| 4,309,225 | 1/1982 | Fan et al. | 156/DIG. 80 |
| 4,371,421 | 2/1983 | Fan et al. | 156/617 R |
| 4,410,562 | 10/1983 | Nemoto et al. | 427/54.1 |
| 4,427,723 | 1/1984 | Swain | 427/53.1 |
| 4,476,154 | 10/1984 | Iesaka et al. | 427/53.1 |
| 4,479,846 | 10/1984 | Smith et al. | 156/DIG. 73 |

FOREIGN PATENT DOCUMENTS

| | | | |
|---|---|---|---|
| 181189 | 1/1984 | Japan | 156/617 R |
| 8691 | 1/1984 | Japan | 156/617 R |
| 2119680 | 11/1983 | United Kingdom | 156/DIG. 73 |

OTHER PUBLICATIONS

Hess et al., "Laser Annealing", *Industrial Research Development*, Nov. 1979, pp. 141-152.

Primary Examiner—David L. Lacey
Attorney, Agent, or Firm—Staas & Halsey

[57] ABSTRACT

A process for producing a monocrystalline layer on an insulator, particularly in a semiconductor wafer adapted for use to produce large-scale integrated circuits, comprising the steps of providing a nonmonocrystalline layer on an insulator and heating a region of the nonmonocrystalline layer by irradiating it from two heat sources while moving the heat sources relative to the nomonocrystalline layer, thereby locally melting and transforming the nonmonocrystalline layer to a monocrystalline layer.

8 Claims, 6 Drawing Figures

PROCESS FOR PRODUCING MONOCRYSTALLINE LAYER ON INSULATOR

BACKGROUND OF THE INVENTION

The present invention relates to a process for producing a monocrystalline layer on an insulator and, more particularly, for growing a monocrystalline layer by locally annealing for a short time a nonmonocrystalline layer formed on an insulator on a semiconductor wafer.

Considerable research has been performed with the goal of producing a monocrystalline layer of silicon on an insulator, and particularly for producing three-dimensional large-scale integrated circuits (LSI's). A silicon wafer for such use generally accommodates three-dimensional LSI's in the bulk of the wafer.

In the prior art, the silicon wafer is mounted on a carbon plate heater to heat the entire bulk of the wafer by conduction to about 1,200° C. At the same time, a carbon strip heater moves over the silicon wafer to anneal by heat radiation a local region of the wafer at about 1,420° C., the melting point of silicon. The beam of heat from the carbon strip heater melts the local region so as to transform the polycrystalline silicon to monocrystalline silicon. Semiconductor elements can then be formed on the silicon monocrystalline layer. The overall heating and local annealing of the wafer, of course, are conducted in an inert atmosphere so as to reduce oxidation and evaporation of the carbon.

This prior art, however, has the drawback that the protracted heating of the overall wafer at 1,200° C. causes rediffusion of the impurity previously implanted in the wafer. This in turn leads to deteriorated performance of the produced LSI's.

S. Iwamatsu discloses, in Japanese Unexamined Patent Publication (Kokai) No. 56-80138, using a rod-like heat source, such as a xenon lamp provided with a reflective mirror, to scan an energy beam having a linear section over a semiconductor wafer or a layer deposited thereon. From our experience, however, it is substantially impossible for a single commercially available lamp to melt a portion of a semiconductor wafer and transform a nonmonocrystalline layer of silicon to a monocrystalline layer due to its low emitting power, even if the beam is focused thereon.

M. Haond et al disclose, in Electronics Letters, Aug. 19, 1982, vol. 18, No. 17, using a plurality of low-power halogen lamps to preheat a wafer from the back side to a temperature of 300° C. to 1100° C. and using a beam focused on the front surface to supply the additional amount of energy necessary to reach a temperature from 1,000° C. to the melting point of silicon on a certain spot, typically 1 cm in diameter. This annealing is carried out in ambient air while the sample is moved along a spiral at a constant speed. We consider, however, that in this setup, the wafer is still heated as a whole from the back side by the plurality of lamps, which leads to rediffusion of a previously implanted impurity.

SUMMARY OF THE INVENTION

It is a primary object of the present invention to provide a process for producing a monocrystalline layer on an insulator.

It is another object of the present invention to provide a process for producing a monocrystalline layer on an insulator with reduced thermal strain in the monocrystalline layer.

It is still another object of the present invention to provide a process for producing a monocrystalline layer on an insulator provided in a semiconductor wafer with reduced rediffusion of the previously implanted impurity.

According to the present invention, there is provided a process for producing a monocrystalline layer on an insulator, particularly in a wafer adapted for use in producing LSI's, comprising the steps of providing a nonmonocrystalline layer on an insulator and heating a region of the monocrystalline layer by irradiation from two heat sources while moving the heat sources relative to the nonmonocrystalline layer, thereby locally melting and transforming the nonmonocrystalline layer to a monocrystalline layer.

BRIEF DESCRIPTION OF THE DRAWINGS

These and other objects and advantages of the present invention will become apparent from the ensuing description of the preferred embodiments made with reference to the accompanying figures, wherein.

DESCRIPTION OF THE PREFERRED EMBODIMENTS

Figure 1:
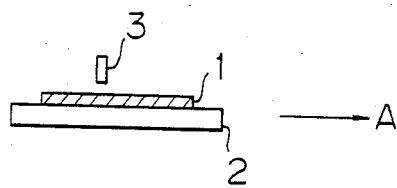
FIG. 1 is a schematic view of a process for annealing a nonmonocrystalline layer according to a prior art.

The prior art will be schematically illustrated referring to FIG. 1. A silicon wafer 1 is mounted on a carbon plate heater 2. A carbon strip heater 3 moves over the silicon wafer 1. The carbon plate heater 2 heats the bulk of the silicon wafer 1 overall by conduction, while the carbon strip heater 3 anneals by heat radiation a local region of the silicon wafer 1. Although not shown in the figure, the beam of heat from the carbon strip heater 3 melts the local region so as to transform the polycrystalline silicon to monocrystalline silicon.

Figure 2:
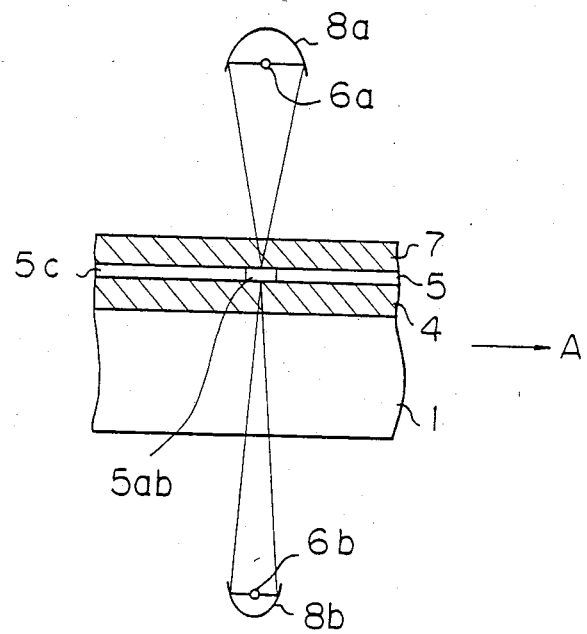
FIG. 2 is a schematic view of an embodiment according to the present invention.

FIG. 2 is a schematic view of an embodiment according to the present invention. Referring to FIG. 2, a silicon wafer 1 is covered with an oxide layer 4 and a polycrystalline silicon layer 5. The wafer 1 moves toward the direction A relative to lamps 6a, 6b located at opposite sides thereof. The first lamp 6a is located at the front of an oxide cap layer 7 and is provided with an elliptical semicylindrical reflective mirror 8a for focusing the beam of heat at a region 5ab to be melted. The second lamp 6b, provided with an elliptical semicylindrical reflective mirror 8b, is located at the back of the bulk of the silicon wafer 1.

The lamps are preferably rod-like lamps, such as halogen or inert-gas filled tungsten lamps or mercury discharge lamps.

In FIG. 2, the beams of heat emitted from the two lamps are focused on the same region 5ab. To reduce the thermal strain at the transformed monocrystalline layer 5c, however, it is possible to widen the focus of one of the beams at the region 5ab. Also, the second lamp 6b may have less power than the first lamp 6a.

Figure 3:
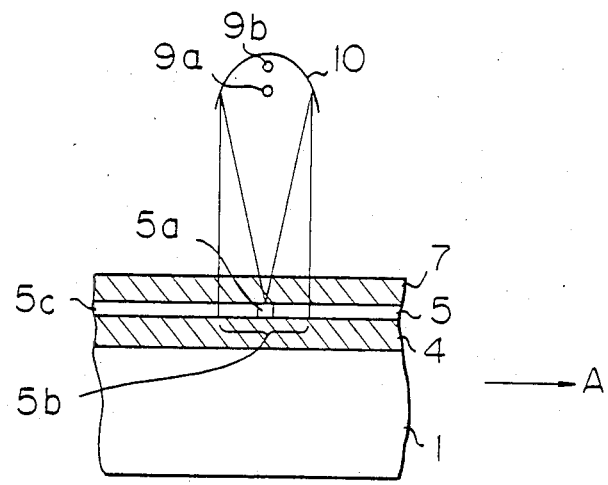
FIG. 3 is a schematic view of another embodiment according to the present invention.

Referring to FIG. 3, a similar silicon wafer 1 is irradiated with beams of heat emitted from two lamps 9a, 9b, both located at the front of the silicon wafer 1. A single elliptical semicylindrical reflective mirror 10 is provided for the two lamps 9a, 9b, thus reducing the size and simplifying the structure of the heat sources. During relative movement of the silicon wafer 1 in the direction A, the lamp 9a heats a narrow region 5a, while the lamp 9b heats a broader region 5b. This also reduces the thermal strain.

EXAMPLE 1

Figure 4:
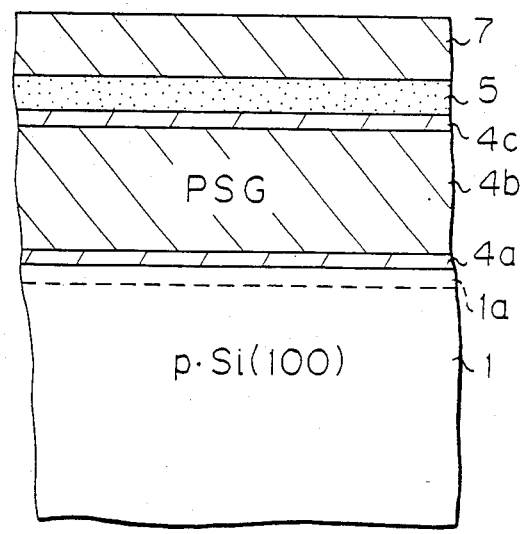
FIG. 4 is a sectional view of a semiconductor wafer in which a nonmonocrystalline layer is formed on an insulator.

In order to test the effect of the present invention, we used a semiconductor wafer sample as shown in FIG. 4. The sample comprised a crystal surface (100) p-type silicon wafer 1 of 400 um thickness having an As ion-implanted layer 1a and sequentially thereon a $Si_3N_4$ layer 4a, a phosphosilicate glass (PSG) insulator layer 4b, another $Si_3N_4$ layer 4c, a polycrystalline silicon layer 5 of 0.4 um thickness, and a thick PSG cap layer 7.

The sample was inserted between two halogen-filled tungsten lamps as shown in FIG. 2. The two lamps 6a, 6b irradiated the sample with beams of heat focused at region 5ab. The front and back beams had a thermal density of 500 $W/cm^2$ and 100 $W/cm^2$, respectively. The relative speed of movement of the sample to the beams was 5.4 cm/min. Thus, the polycrystalline silicon layer 5 was melted and transformed to a monocrystalline layer 5c.

Figure 6:
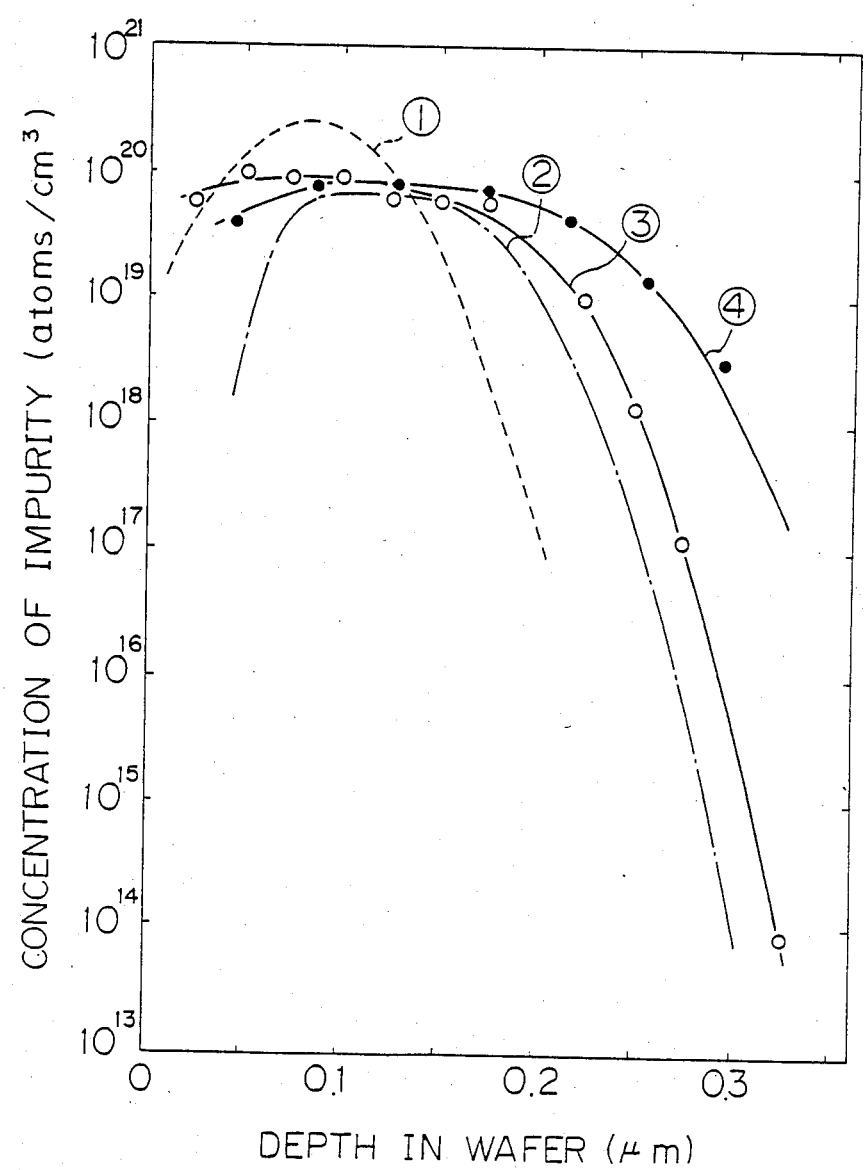
FIG. 6 is a graph of the relationship between the concentration of the impurity and the depth in a semiconductor wafer.

FIG. 6 shows the impurity profile of semiconductor wafers, i.e., the relationship between the depth of the semiconductor wafer and the concentration of the impurity. Curve 1 shows the profile of As ion impurity as implanted with a dose rate of $2 \times 10^{15}/cm^2$ at 150 keV. Curve 2 shows the profile immediately after growing the layers 4a, 4b, 4c, 5, and 7, shown in FIG. 4. Curve 3 shows the profile after annealing of the layer 5 so as to form a monocrystalline silicon layer according to the present invention. Curve 4 is comparative and shows the profile after annealing the wafer as a whole at 1,050° C. for 10 minutes. With respect to such results in a conventional furnace, it can be seen that the redistribution of the implanted impurity is negligibly small after recrystallizing the polycrystalline silicon layer according to the present invention.

EXAMPLE 2

We conducted a similar annealing test using the arrangement shown in FIG. 3. The thickness of the polycrystalline silicon layer 5 was 0.5 um. The heat sources were argon-filled tungsten lamps 9a, 9b, provided with a single elliptical semicylindrical reflective mirror 10. One lamp 9a was located at the focal line of the elliptical of the mirror 10, while the other lamp 9b was located just above the same focal line. The beam of heat from the lamp 9a focused on a region 5a of the polycrystalline silicon layer 5. The beam of heat from the lamp 9b was not focused on the region 5a, but was diffused over a wider region 5b. The scanning speed of the sample was 6.0 cm/min. The polycrystalline silicon layer 5 was melted and transformed to superior quality monocrystalline silicon region 5c. The diffusion of the beam of heat from the lamp 9b had the effect of reducing the thermal strain in the monocrystalline silicon layer 5c.

EXAMPLE 3

Figure 5:
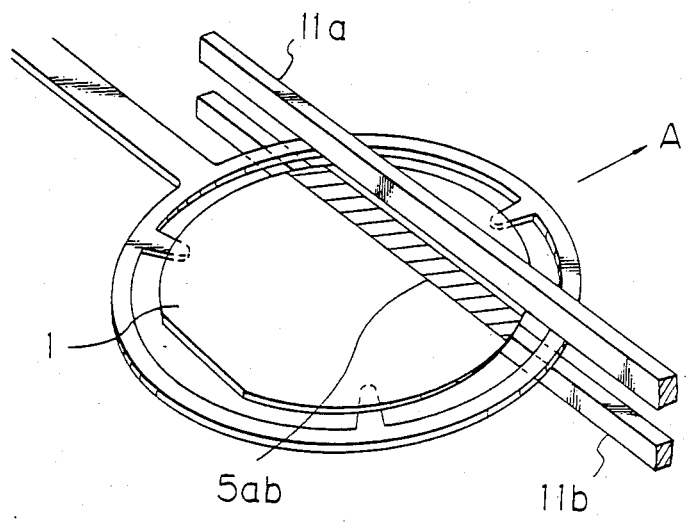
FIG. 5 is a schematic view of still another embodiment according to the present invention.

We subjected a semiconductor wafer 1 similar to that of Example 1 to an irradiating test with two rod-like carbon heaters 11a, 11b located at oppposite sides of the wafer, as shown in FIG. 5. The front heater 11a was located 1 mm above the wafer 1, and the back heater 11b was located 5 mm under the wafer 1. The heaters were heated to a surface temperature of about 1,500° C. They scanned the wafer at a speed of 6.0 cm/min toward the direction A and melted a polycrystalline silicon layer in line 5ab to transform it into monocrystalline silicon. The test was conducted in a nitrogen atmosphere. A similar result was obtained as that in Example 1 with respect to the recrystallization of the polycrystalline silicon layer and the redistribution of the impurity.

I claim:

1. A process for producing a monocrystalline layer on an insulating layer formed on a front side of a semiconductor substrate having at least one impurity region containing impurities under said insulating layer, comprising the steps of:
    providing a nonmonocrystalline layer with a back side on said insulating layer over said at least one impurity region in said substrate; and
    heating a local portion of said nonmonocrystalline layer without causing substantial redistribution of said impurities in said at least one impurity region by irradiating said local portion with two energy beams emitted from two respective rod-like heat sources located apart from and parallel to said substrate, wherein a first of said energy beams irradiates said nonmonocrystalline layer from the front side of said nonmonocrystalline layer with an energy density that is larger than that of the other energy beam, and said other energy beam irradiates either the front side of said nonmonocrystalline layer or a back side of said substrate, while moving said energy beams relative to said nonmonocrystalline layer, wherein said nonmonocrystaline layer is locally melted and transformed to a monocrystalline layer during said moving as a result of the irradiation.

2. A process according to claim 1, wherein said two heat sources are located at opposite sides of said nonmonocrystalline layer.

3. A process according to claim 2, wherein said heat sources are rod-like lamps, each provided with a respective elliptical semicylindrical reflecting mirror, at least one of said lamps is located at said front side of said nonmonocrystalline layer along a focal line of an ellipse of the respective elliptical semicylindrical reflective mirror, and provides an irradiated region which is located at the other focal line of said ellipse.

4. A process according to claim 3, said rod-like lamps being selected from the group consisting of halogen and inert-gas filled tungsten lamps and mercury discharge lamps.

5. A process according to claim 2, wherein said heat sources are rod-like carbon heaters.

6. A process according to claim 1, wherein said two heat sources are located at the same side of said nonmonocrystalline layer.

7. A process according to claim 6, wherein said heat sources are rod-like lamps, each provided with an elliptical semicylindrical reflective mirror, at least one of said lamps is located at said front side of said nonmonocrystalline layer along a focal line of an ellipse of the respective elliptical semicylindrical reflective mirror, and provides an irradiated region which is located at the other focal line of said ellipse.

8. A process according to claim 7, said rod-like lamps being selected from the group consisting of halogen and inert-gas filled tungsten lamps and mercury discharge lamps.

* * * * *

UNITED STATES PATENT AND TRADEMARK OFFICE
CERTIFICATE OF CORRECTION

PATENT NO. : 4,659,422

DATED : April 21, 1987

INVENTOR(S) : Sakurai

It is certified that error appears in the above-identified patent and that said Letters Patent is hereby corrected as shown below:

[73] "Kanagawa" should be --Kawasaki--.

Signed and Sealed this

Tenth Day of November, 1987

Attest:

DONALD J. QUIGG

*Attesting Officer*  *Commissioner of Patents and Trademarks*